US009066171B2

(12) United States Patent
Rauhala et al.

(10) Patent No.: US 9,066,171 B2
(45) Date of Patent: Jun. 23, 2015

(54) LOUDSPEAKER PROTECTION APPARATUS AND METHOD THEREOF

(75) Inventors: Jukka Vesa Tapani V. Rauhala, Vantaa (FI); Jouni Paaaho, Ikaalinen (FI)

(73) Assignee: Nokia Corporation, Espoo (FI)

( * ) Notice: Subject to any disclaimer, the term of this patent is extended or adjusted under 35 U.S.C. 154(b) by 339 days.

(21) Appl. No.: 13/518,839

(22) PCT Filed: Dec. 24, 2009

(86) PCT No.: PCT/EP2009/067927
§ 371 (c)(1), (2), (4) Date: Aug. 6, 2012

(87) PCT Pub. No.: WO2011/076288
PCT Pub. Date: Jun. 30, 2011

(65) Prior Publication Data
US 2012/0300949 A1 Nov. 29, 2012

(51) Int. Cl.
*H03G 11/00* (2006.01)
*H04R 3/00* (2006.01)
*H04R 29/00* (2006.01)

(52) U.S. Cl.
CPC ................ *H04R 3/007* (2013.01); *H04R 3/002* (2013.01); *H04R 29/001* (2013.01)

(58) Field of Classification Search
CPC .................................. H03G 11/00; H04R 3/00
USPC .............................. 381/55, 58–59, 96, 98–99
See application file for complete search history.

(56) References Cited

U.S. PATENT DOCUMENTS

| | | | | |
|---|---|---|---|---|
| 4,093,822 | A * | 6/1978 | Steinle | 381/99 |
| 5,528,695 | A | 6/1996 | Klippel et al. | |
| 5,719,526 | A * | 2/1998 | Fink | 330/2 |
| 6,058,195 | A | 5/2000 | Klippel et al. | |
| 7,372,966 | B2 * | 5/2008 | Bright | 381/55 |
| 2003/0072462 | A1 * | 4/2003 | Hlibowicki | 381/96 |
| 2004/0086140 | A1 * | 5/2004 | Fedigan et al. | 381/96 |
| 2005/0004691 | A1 * | 1/2005 | Edwards | 700/94 |
| 2005/0031139 | A1 | 2/2005 | Browning | |
| 2005/0207584 | A1 * | 9/2005 | Bright | 381/59 |

(Continued)

FOREIGN PATENT DOCUMENTS

| | | |
|---|---|---|
| WO | 01/03466 A2 | 1/2001 |
| WO | 0103466 | 1/2001 |
| WO | 2004016040 | 2/2004 |

OTHER PUBLICATIONS

Office Action received for corresponding German Application No. 112009005469.2, dated May, 8, 2014, 8 pages.

(Continued)

*Primary Examiner* — Disler Paul
(74) *Attorney, Agent, or Firm* — Harrington & Smith

(57) ABSTRACT

An apparatus comprises at least one processor; and at least one memory including computer program code; the at least one memory and the computer program code configured to, with the at least one processor, cause the apparatus at least to: determine at least one parameter of a transducer on the basis of received information; and modify a received signal for actuating the transducer on the basis of the determined parameters of the transducer and a frequency spectrum of the received signal. The apparatus protects the transducer from damage due to excessive displacement caused by the received signal.

20 Claims, 8 Drawing Sheets

(56) References Cited

U.S. PATENT DOCUMENTS

| | | | | |
|---|---|---|---|---|
| 2009/0092265 | A1 | 4/2009 | Lovejoy | |
| 2011/0116643 | A1* | 5/2011 | Tiscareno et al. | 381/58 |

OTHER PUBLICATIONS

International Search Report and Written Opinion received for corresponding International Patent Application No. PCT/EP2009/067927, dated Sep. 21, 2010, 11 pages.

* cited by examiner

LOUDSPEAKER PROTECTION APPARATUS AND METHOD THEREOF

RELATED APPLICATION

This application was originally filed as PCT Application No. PCT/EP2009/067927 filed Dec. 24, 2009.

The present application relates to a method and apparatus. In some embodiments the method and apparatus relate to a modifying a drive signal for protecting a transducer.

Some portable electronic devices comprise transducers such as loudspeakers and/or earpieces which are required to be small in size. Transducers are important components in electronic devices such as mobile phones for the purposes of playing back music or having a telephone conversation. The quality and loudness of a transducer in an electronic device are important especially if a user listens to sounds generated by an electronic device at a distance from the electronic device.

In order to obtain a certain loudness from transducers, such as electroacoustic loudspeakers, drive signal levels of the transducers have been typically been increased. However, transducers may be vulnerable to high drive signals which can damage or impair the performance of the loudspeaker because the high drive signal may cause an excessive vibration displacement of the moving parts of the loudspeaker. In particular of a coil-diaphragm assembly of an electroacoustic loudspeaker is vulnerable to damage from excessive vibration displacement.

It is known to process an input signal for a transducer by passing the original input signal through a filter. The filter provides a cut-off frequency and attenuation gain which are controlled in dependence of an estimated displacement of a coil-diaphragm assembly in a transducer such as an electroacoustic loudspeaker. However, the filter provides a coarse attenuation of the original audio signal which may attenuate the entire bass frequency range of the original audio signal. This may appear to a user that sound waves produced from a transducer using signals from the filter are unusually bright due to an attenuation of bass frequencies.

Another problem with the known systems is that loudspeakers vary in construction and performance. As the model-based loudspeaker protection is not robust against deviations in estimated parameter values, loudspeakers may be susceptible to damage as the loudspeaker protection does not perform well enough due to manufacturing tolerances.

Embodiments of the present invention aim to address one or more of the above problems.

In a first aspect of the invention there is an apparatus comprising: at least one processor; and at least one memory including computer program code; the at least one memory and the computer program code configured to, with the at least one processor, cause the apparatus at least to: determine at least one parameter of a transducer on the basis of received information; and modify a received signal for actuating the transducer on the basis of the determined parameters of the transducer and a frequency spectrum of the received signal.

Preferably the processor is configured to output a modified signal for the transducer.

Preferably the received signal for actuating the transducer is configured to displace a first part of the transducer from a second part of the transducer.

Preferably the apparatus comprises a first filter configured to modify the received signal by attenuating the received signal.

Preferably the first filter is configured to attenuate a first portion of the frequency spectrum in dependence of a second portion of the frequency spectrum.

Preferably the apparatus comprises a second filter for compensating the received signal on the basis of received information comprising environmental information of the transducer.

Preferably the environmental information is temperature information of the transducer.

Preferably the processor is configured to determine a maximum displacement of the first part of the transducer and the second part of the transducer.

Preferably the processor is configured to estimate a displacement of the first part of the transducer from the second part of the transducer on the basis of the received signal.

Preferably the first filter attenuates the received signal when the processor determines that the estimated displacement first part of the transducer from second part of the transducer is greater than the maximum displacement.

Preferably the at least one parameter is determined from one or more of the following: voltage across the poles of the transducer, current through the transducer, voltage of the modified signal to be outputted to the transducer.

Preferably the at least one parameter is one or more of the following; impedance of the transducer, resistance of a component of the transducer, transduction coefficient, resonance frequency and resonance Q value.

Preferably the transducer is a loudspeaker.

Preferably processor is configured to dynamically determine the at least one parameter of the transducer.

In a second aspect of the invention there is provided a user terminal comprising an apparatus as described above.

An electronic device may comprise an apparatus as described above.

A chipset may comprise an apparatus as described above.

In a third aspect of the invention there is provided a method comprising: determining at least one parameter of a transducer on the basis of received information; and modifying a received signal for actuating the transducer on the basis of the determined parameters of the transducer and a frequency spectrum of the received signal.

Preferably the method further comprises outputting a modified signal for the transducer.

Preferably the received signal for actuating the transducer displaces a first part of the transducer from a second part of the transducer.

Preferably the method comprises modifying the received signal by attenuating the received signal.

Preferably the method comprises attenuating a first portion of the frequency spectrum in dependence of a second portion of the frequency spectrum.

Preferably the method comprises compensating the received signal on the basis of received information comprising environmental information of the transducer.

Preferably the environmental information is temperature information of the transducer.

Preferably the method comprises determining a maximum displacement of the first part of the transducer and the second part of the transducer.

Preferably the method comprises estimating a displacement of the first part of the transducer from the second part of the transducer on the basis of the received signal.

Preferably the method comprises attenuating the received signal when determining that the estimated displacement first part of the transducer from second part of the transducer is greater than the maximum displacement.

Preferably the at least one parameter is determined from one or more of the following: voltage across the poles of the transducer, current through the transducer, voltage of the modified signal to be outputted to the transducer.

Preferably the at least one parameter is one or more of the following; impedance of the transducer, resistance of a component of the transducer, transduction coefficient, resonance frequency and resonance Q value.

Preferably the method comprises dynamically determining the at least one parameter of the transducer.

In a fourth aspect the invention provides a computer program comprising code means adapted to perform the steps of the method described above when the program is run on a processor.

In a fifth aspect of the invention there is an apparatus comprising: means for determining at least one parameter of a transducer on the basis of received information; and means for modifying a received signal for actuating the transducer on the basis of the determined parameters of the transducer and a frequency spectrum of the received signal.

For a better understanding of the present application and as to how the same may be carried into effect, reference will now be made by way of example to the accompanying drawings in which.

The following describes apparatus and methods for modifying a drive signal for protecting a transducer.

Figure 1:
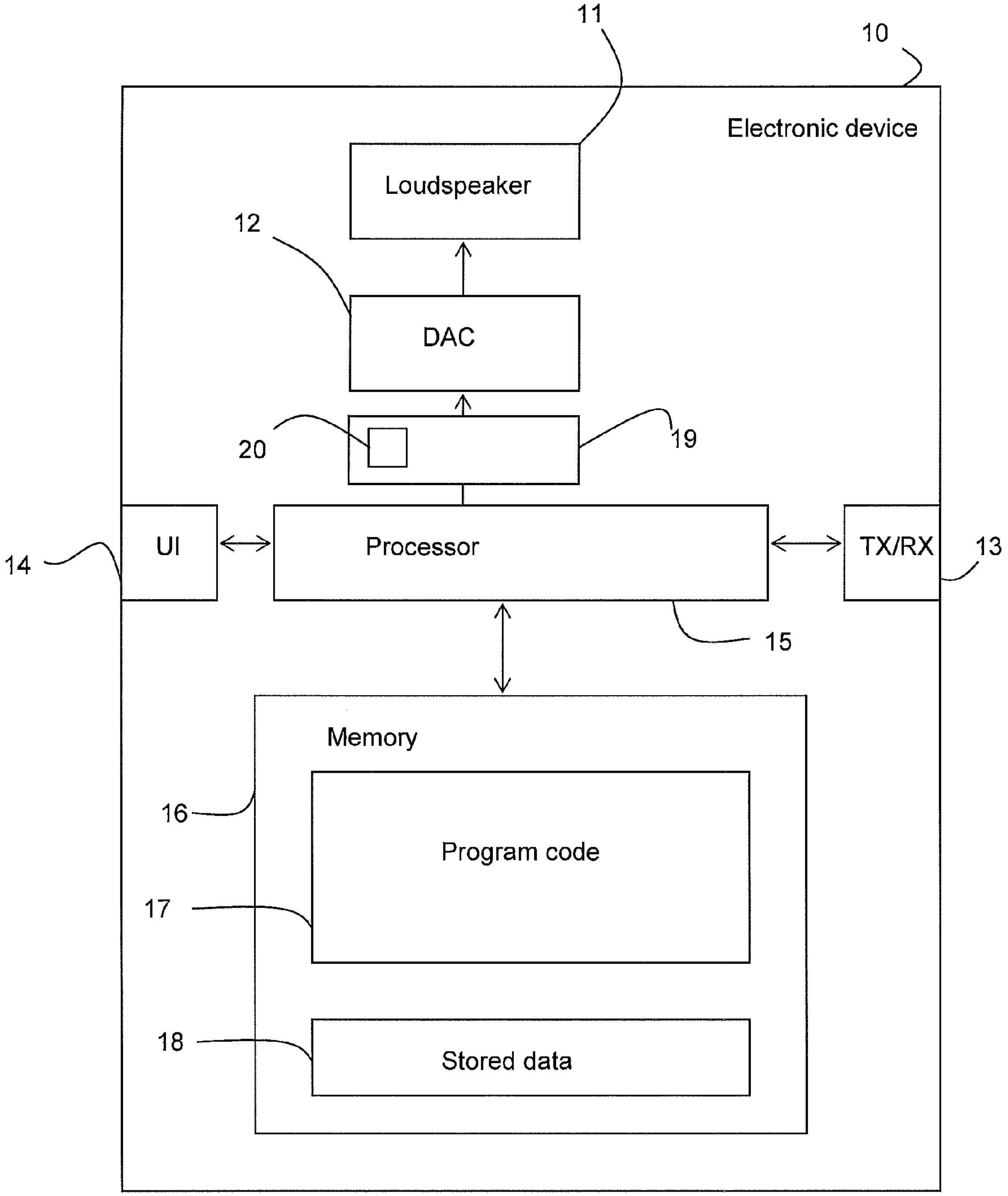
FIG. 1 illustrates a schematic block diagram of an apparatus according to some embodiments.

FIG. 1 discloses a schematic representation of an electronic device or apparatus 10 comprising a transducer 11. The transducer 11 may be an integrated speaker such as an integrated hands free speaker, (IHF), loudspeaker or an earpiece.

The transducer 11 may be a dynamic or moving coil, a piezoelectric transducer, an electrostatic transducer or a transducer array comprising microelectromechanical systems (MEMS). Additionally or alternatively the transducer comprises a multifunction device (MFD) component having any of the following; combined earpiece, integrated handsfree speaker, vibration generation means or a combination thereof.

The apparatus 10 in some embodiments may be a mobile phone, portable audio device, or other means for playing sound. The apparatus 10 has a sound outlet for permitting sound waves to pass from the transducer 11 to the exterior environment.

The apparatus 10 is in some embodiments a mobile terminal, mobile phone or user equipment for operation in a wireless communication system.

In other embodiments, the apparatus 10 is any suitable electronic device configured to generate sound, such as for example a digital camera, a portable audio player (mp3 player), a portable video player (mp4 player). In other embodiments the apparatus may be any suitable electronic device with a speaker configured to generate sound.

In some embodiments, the apparatus 10 comprises a sound generating module 19 which is linked to a processor 15. The processor 15 may be configured to execute various program codes. The implemented program codes may comprise a code for controlling the transducer 11 to generate sound waves. In some embodiments the sound generating module 19 comprises a transducer protection module 20 for modifying the audio signals for the transducer 11.

The implemented program codes in some embodiments 17 may be stored for example in the memory 16 for retrieval by the processor 15 whenever needed. The memory 16 could further provide a section 18 for storing data, for example data that has been processed in accordance with the embodiments. The code may, in some embodiments, be implemented at least partially in hardware or firmware.

In some embodiments the processor 15 is linked via a digital-to-analogue converter (DAC) 12 to the transducer 11. The digital to analogue converter (DAC) 12 may be any suitable converter.

In some embodiments the DAC 12 may send an electronic audio signal output to the transducer 11 and on receiving the audio signal from the DAC 12, the transducer 11 generates acoustic waves. In other embodiments, the apparatus 10 may receive control signals for controlling the transducer 11 from another electronic device.

The processor 15 may be further linked to a transceiver (TX/RX) 13, to a user interface (UI) 14 and to a display (not shown). The user interface 14 may enable a user to input commands or data to the apparatus 10. Any suitable input technology may be employed by the apparatus 10. It would be understood for example the apparatus in some embodiments may employ at least one of a keypad, keyboard, mouse, trackball, touch screen, joystick and wireless controller to provide inputs to the apparatus 10.

Figure 2:
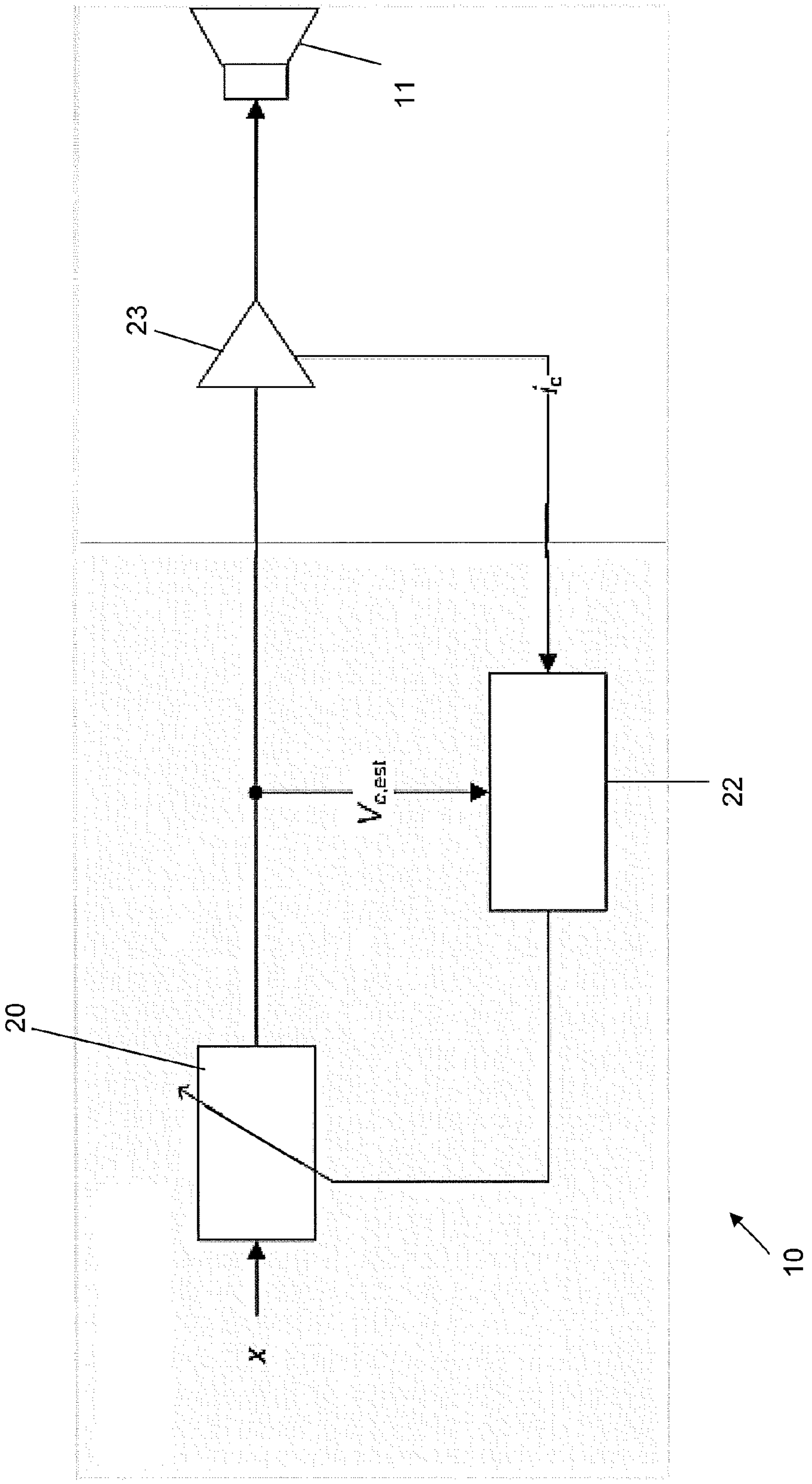
FIG. 2 illustrates a schematic block diagram of an apparatus according to some further embodiments.
Figure 8:
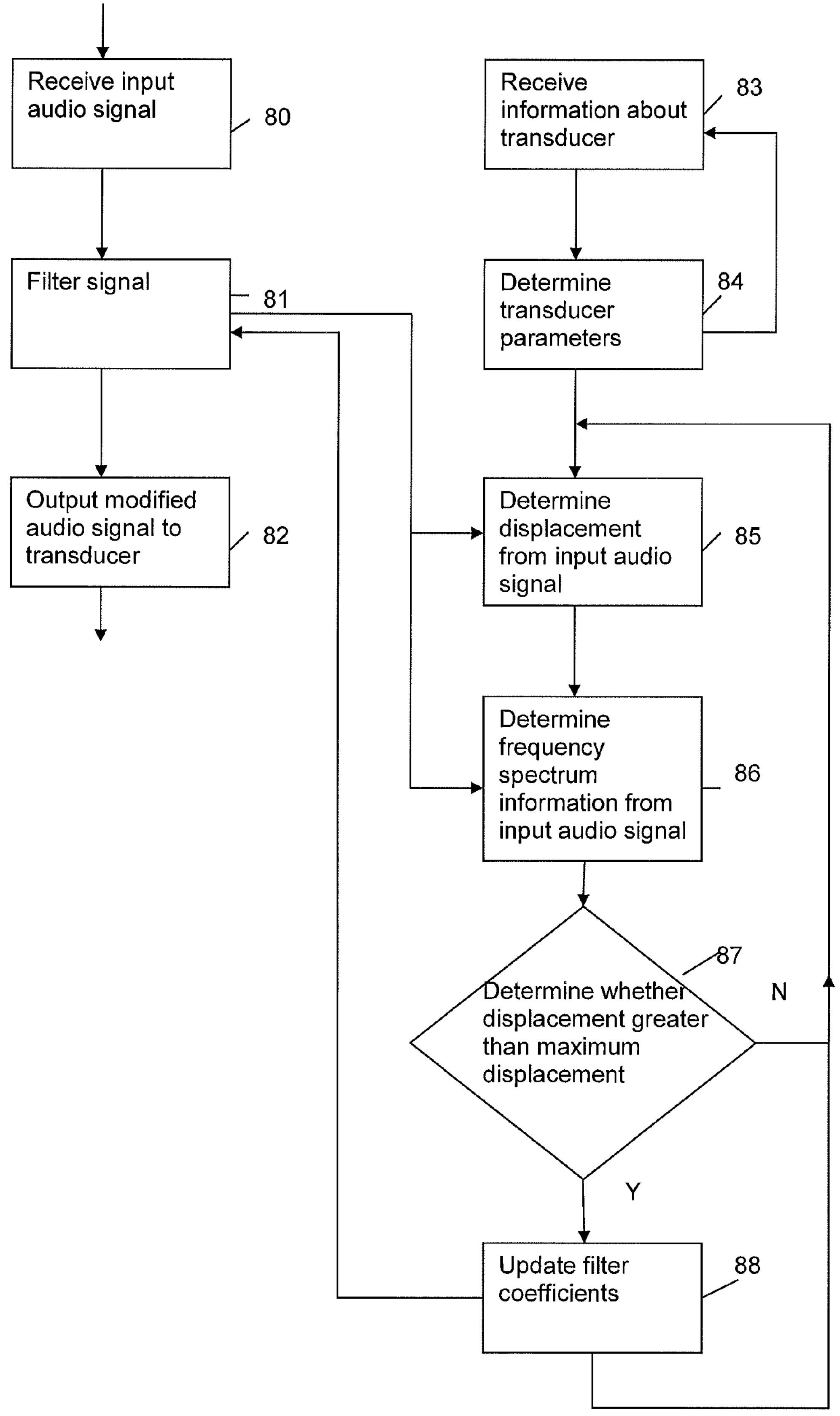
FIG. 8 illustrates a flow diagram of the method performed by the apparatus according to some embodiments.

FIG. 2 illustrates a schematic block diagram according to some embodiments. An apparatus 10 receives a signal which in some embodiments is an input audio signal X for a transducer 11 as shown in block 80 in FIG. 8. FIG. 8 shows a schematic flow diagram of the process according to some embodiments.

The apparatus 10 shows a simplified block diagram of an arrangement for processing a signal. For the purposes of the clarity, only the components for processing the input audio signal X to protect the transducer 11 have been shown. In some embodiments there are additional signal processing components which may modify an input signal before a signal is outputted to a transducer for driving the transducer 11.

The input signal X is a signal for actuating the transducer 11. In some embodiments the input signal X is information for playing back music using the transducer 11. In other embodiments the input signal X may be information for listening to the conversation with a transducer 11 such as an integrated hands free loudspeaker .

In some embodiments the input audio signal X is received at a transducer protection module 20 for attenuating the input audio signal X. The operation of receiving the input audio signal X is shown in step 81 of FIG. 8. The transducer protection module 20 comprises a transducer protection filter configured to attenuate the input audio signal X such that a drive signal is sent to the transducer 11 which prevents excessive displacement of a first part of the transducer from a second part of the transducer 11.

In some embodiments the transducer is an electroacoustic loudspeaker. The electroacoustic loudspeaker comprises a coil-diaphragm assembly wherein a coil and a diaphragm move from a rest position when a drive signal actuates the transducer 11. In some embodiments the first part of the transducer is the moveable coil-diaphragm assembly and the second part is a static portion of loudspeaker such as a frame of the loudspeaker. An excessive displacement occurs if the diaphragm is displaced by a distance from the rest position such that damage occurs and the performance of the transducer is impaired. Alternatively or additionally excessive displacement may occur also when distortion due to nonlinearities of a component or an implementation exceed a desired value. In some embodiments the transducer protection module 20 may comprise mechanical components and/or circuitry.

An parameter estimation module 22 receives information regarding the transducer 11. The operation of receiving information regarding the transducer 11 is shown in step 83 of FIG. 8. The parameter estimation module 22 determines parameters of the transducer 11 on the basis of the received information. The operation of determining parameters of the transducer is as shown in step 84. In some embodiments the received information are measurements of the transducer 11. For example, the measurements may comprise current and voltage information measured between loudspeaker poles of the transducer 11. Additionally or alternatively the voltage is estimated based on the output signal from the transducer protection filter 20.

The parameter estimation module 22 sends the estimated transducer parameters to the transducer protection module 20. The operation of sending the estimated transducer parameters from the parameter estimation module 22 to the transducer protection module is shown as the arrow linking steps 84 and 85.

On the basis of the received determined parameters of the transducer 11 and the received input audio signal, the transducer protection module 20 determines the estimated displacement which the output audio signal Y would cause the coil and diaphragm to move from the rest position as shown in step 85.

The transducer protection module 20 retrieves a maximum allowable displacement of the coil and the diaphragm to move from the rest position from memory 16. The maximum displacement is a predetermined threshold above which damage may be caused to the transducer 11. Furthermore, in some embodiments the transducer protection module 20 retrieves a displacement limit from memory. The displacement limit is a predetermined threshold of the displacement of the coil and diaphragm to move from the rest position above which the input audio signal X is modified. Below the displacement limit no modification of the audio input signal X may be required.

Additionally, in some embodiments the transducer protection module 20 may compare the estimated displacement determined from the input audio signal X and the displacement limit of the transducer. The transducer protection module 20 decides whether any modification to the input audio signal X is necessary. The operation of comparing the estimated displacement and the maximum displacement is not shown is carried out after step 85 and before step 86. When the transducer protection module 20 estimates that the output audio signal Y would cause a displacement which is greater than the predetermined displacement limit of the transducer 11, the transducer protection module 20 proceeds to determine frequency spectrum information from the input audio signal and determine whether the estimated displacement is greater than the maximum displacement as discussed below in reference to steps 86 and 87.

In some embodiments the transducer protection module 20 determines the frequency ranges which are dominating an output displacement signal of the transducer from the received input audio signal X. The output displacement signal is a signal which causes displacement of the transducer. In some embodiments the output displacement signal may be determined from the output audio signal Y. The operation of determining frequency ranges which are dominating in the output displacement signal is shown in step 86. In some embodiments the transducer protection module 20 may determine to control the attenuation characteristics of the transducer protection filter on the basis of the determined frequency spectrum displacement information.

The transducer protection module 20 compares the estimated displacement determined from the input audio signal X and the maximum displacement of the transducer. The operation of comparing the estimated displacement and the maximum displacement is shown in step 87. When the transducer protection module 20 estimates that the output audio signal Y would cause a displacement which is greater than a determined maximum displacement of the transducer 11, the transducer protection module 20 sends a control signal to the transducer protection filter. The operation of sending a control signal is shown in step 88. In order to increase or decrease attenuation of the input audio signal X, the analysing module may update the parameters of the transducer protection filter to modify the attenuation characteristics of the transducer protection filter. In some embodiments the control signal causes the transducer protection filter to attenuate the received signal.

In some embodiments there may be a further decision step similar to decision step 87 to determine whether modifying the input audio signal X on the basis of the frequency spectrum is necessary. In other embodiments, the input audio signal X is modified on the basis of the frequency spectrum displacement information only if the estimated displacement is greater than the maximum displacement.

The transducer protection module 20 continues to determine whether the input audio signal X requires modifying on the basis of the estimated displacement caused by the input audio signal and the determined frequency spectrum displacement information. The operation of repeating the steps of determining as shown in steps 85 and 86 is shown in FIG. 8 as an arrow from steps 87 and 88 to between steps 84 and 85. In this way the analysing module dynamically determines the modifications required to the input audio signal x.

In some embodiments the current is measured using sensing amplifier 23. The parameter estimation module 22 receives the information of the measured current from sensing amplifier 23 and the estimated voltage of the output audio signal Y during operation. Indeed, the parameter estimation module 22 receives voltage and current information continually during operation of the transducer 11. In this way the parameter estimation module 22 determines parameters of the transducer 11 dynamically and parameters of a transducer may be updated during operation of the transducer 11. In some embodiments the transducer parameters are continually determined from updated measurements received by the analysing module. The operation of repeating the step of determining the parameteris of the transducer is shown in FIG. 8 as the loop arrow from step 84 to step 83. Advantageously this means the transducer protection module 20 may compensate for variations in environmental conditions and parameters of the transducer 11 during operation of the transducer 11.

In some embodiments the transducer protection filter is a low frequency shelving filter, which is a high pass filter with a flat passband and a flat stopband. The low frequency shelving filter parameters are modified in accordance to a control signal received from the transducer protection module 20. In some embodiments the control signal updates the low frequency shelving filter coefficients to change the filtering characteristics. The control signal from the transducer protection module 20 may cause the low frequency shelving filter to attenuate the input audio signal X more. Alternatively the control signal may cause the low frequency shelving filter to attenuate the input audio signal X less. In some embodiments the transducer protection filter may comprise a plurality of separate filters wherein one or more filters are selected in dependence on the control signal from the transducer protection module 20.

After the input audio signal X is modified by the transducer protection filter, the output audio signal Y is sent to the transducer 11 for driving the transducer 11. The operation of sending the output audio signal is shown in step 82. Other audio signal processing steps may be used before the output audio signal is sent to the transducer 11.

Advantageously the apparatus 10 attenuates an input audio signal X in dependence of parameters of the transducer 11. This means that the input audio signal X is not unnecessarily attenuated due to a predetermined filter selection. Furthermore, the apparatus may be tuned deterministically based on parameters determined by the parameter estimation module 22 and the apparatus 10 does not need to be tuned by trial and error. The apparatus 10 may adapt to changes in parameters of the transducer 11 over time.

Figure 3:
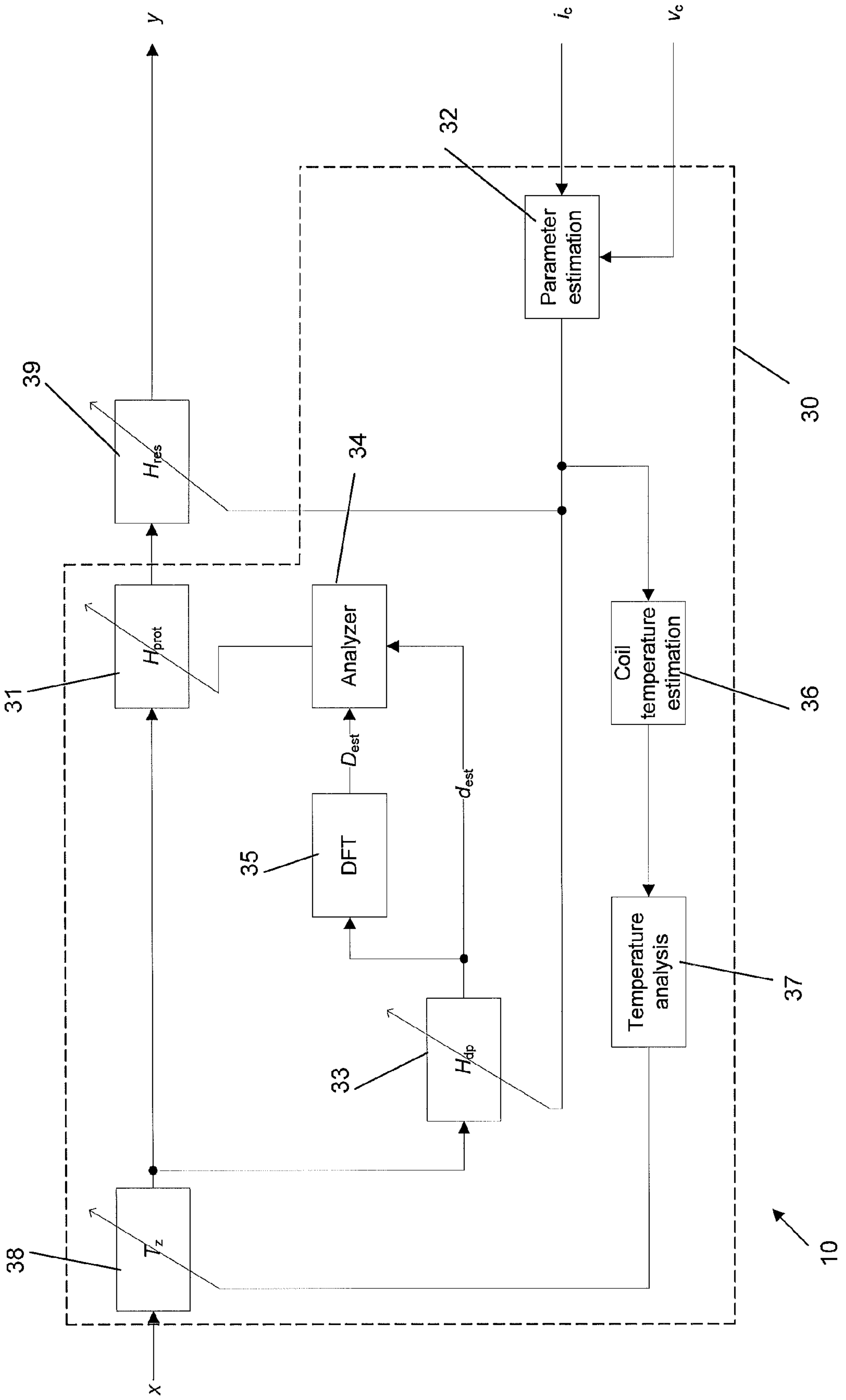
FIG. 3 illustrates a schematic block diagram of an apparatus according to some additional embodiments.

FIG. 3 illustrates a schematic block diagram of some further embodiments. FIG. 3 shows the apparatus 10 comprising a transducer protection module 30.

Similar to the embodiments described with referenced to FIG. 2 the apparatus 10 receives an input audio signal X. The input audio signal X is input into a protection filter 31 configured to limit the displacements in the transducer 11. Similar to previous described embodiments, the transducer protection filter 31 is modified in dependence of updated parameters of the transducer 11.

Parameters of a transducer 11 are estimated in a parameter estimation module 32. The parameter estimation module 32 receives information of the transducer 11. In some embodiments the parameter estimation module receives a measured current signal and a measured voltage signal which are measured across the poles of the transducer 11. In some embodiments the voltage and current are measured by a sensing amplifier The transducer parameters may be estimated by the parameter estimation module 32 based on the measured current and voltage. In some embodiments, the estimation module 32 uses an adaptive model. The parameters determined by the parameter estimation module may be one or more of the following: resistance ($R_{eb}$) of a voice coil of the transducer 11, the transduction coefficient ($\Phi_0$) of the transducer, resonance frequency ($f_c$) or the transducer, and resonance Q value ($Q_c$) of the transducer.

Figure 7:
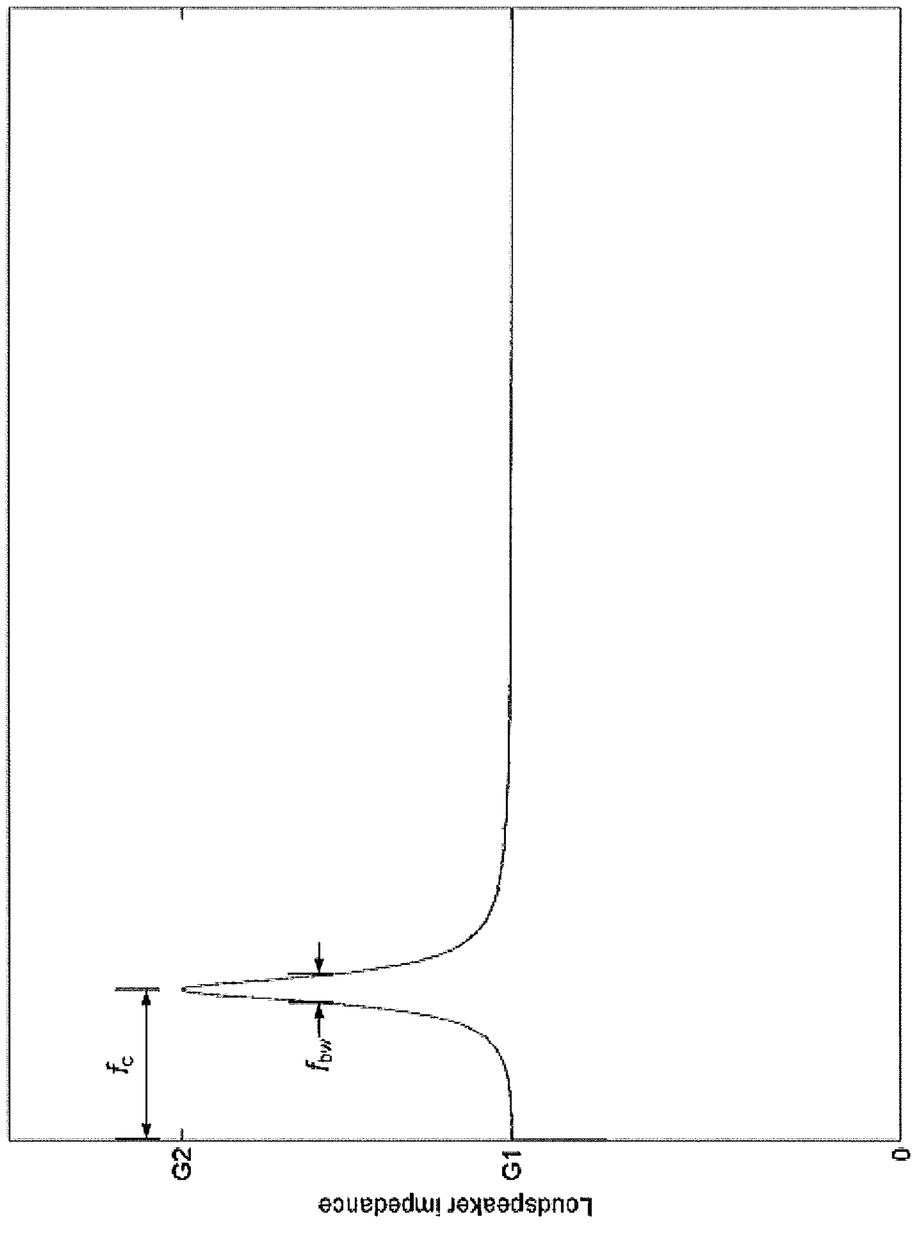
FIG. 7 illustrates a graph of loud speaker impedance versus frequency of a transducer according to some embodiments.

The resistance ($R_{eb}$) of the voice coil may be calculated by the parameter estimation module 32 from the floor level of the magnitude response electrical impedance ($G_1$) of the transducer 11. The transduction coefficient may be determined based on the difference of the highest value ($G_2$) of the magnitude response of the electrical impedance ($G_2$–$G_1$) of the transducer 11 and a floor level of the magnitude response of the electrical impedance of the transducer 11. The parameter estimation module 32 may estimate the resonance frequency ($f_c$) as the frequency of the highest peak in the magnitude response of the transducer's electrical impedance in the frequency domain. The parameter estimation module 32 determines the resonance Q value ($Q_c$) as the ratio of the resonance frequency ($f_c$) and the frequency bandwidth ($f_{bw}$). These parameters of the transducer are exemplified in FIG. 7. FIG. 7 illustrates a graph of transducer impedance versus frequency. In particular, FIG. 7 illustrates the magnitude response of an exemplary loudspeaker's electrical impedance in the frequency domain.

The parameter estimation module 32 then sends the estimated parameter values of the resistance ($R_{eb}$) of the voice coil, the transduction coefficient ($\Phi_0$) of the transducer, the resonance frequency ($f_c$) of the transducer and the resonance Q value ($Q_c$) of the transducer to the displacement estimation filter 33.

On the basis of the received parameter information of the transducer and the input audio signal X, the displacement estimation filter 33 estimates the displacement of parts within the transducer 11 when the transducer 11 is driven by the input audio signal X. The displacement estimation filter 33 then sends the transducer displacement estimate to the analysing module 34. In some embodiments the displacement estimation filter 33 may determine the estimated displacement with the determined loudspeaker parameters based on a loudspeaker model.

The displacement estimation filter 33 sends an output signal to a discrete Fourier transform module 35. The discrete Fourier transform module 35 analyses the input audio signal X and determines frequency spectrum information of the input audio signal X. In particular, the discrete Fourier transform module 35 determines the magnitude response of the estimated transducer displacement across the frequency spectrum of the input audio signal. In this way, information is determined of the range of frequencies that the input audio signal causes displacement of the transducer 11. The discrete Fourier transform module 35 outputs frequency spectrum displacement information to the analysing module 34. Alternatively other time to frequency converters are available such as a fast Fourier transform (FFT).

In some embodiments, the discrete Fourier transform module 35 may receive the input audio signal X which has not passed though the displacement estimation filter 33. In these embodiments, a frequency domain displacement estimation filter is used instead of a time domain displacement estimation filter.

The analysing module 34 determines when the estimated displacement of the transducer 11 exceeds a maximum displacement of the transducer 11. The maximum displacement of the transducer may be determined during calibration of the apparatus and stored in memory 16 of the apparatus which my be accessed by the analysing module 34. Alternatively, the maximum displacement of the transducer 11 is a predetermined parameter. For example the maximum displacement of the transducer 11 may be determined during manufacturing of the apparatus 11.

When the analysing module 34 determines that the estimated transducer displacement exceeds the maximum displacement of the transducer 11, the analysing module 34 sends a command signal to the protection filter 31. In some embodiments, the analysing module 34 sends a signal to the protection filter 31 to update the protection filter coefficients such that the characteristics of the attenuation of the input audio signal X by the protection filter 31 are modified.

The analysing module 34 determines the coefficients of the protection filter 31 which are to be updated on the basis of the frequency spectrum displacement information received from the discrete Fourier transform module 35. In this way, the analysing module 34 can control the attenuation characteristics of the transducer protection filter 31 based displacements of the transducer across the entire frequency spectrum determined by the discrete Fourier transform module 35.

In some embodiments, the analysing module 34 determines that the input signal comprises a broad frequency spectrum and a portion of the frequency spectrum is attenuated in order to protect the transducer 11. In some embodiments, the analysing module 34 determines that a portion of the frequency spectrum is attenuated by a predetermined proportion compared to the rest of the frequency spectrum. In some embodiments the analysing module 34 controls the transducer protection filter 31 attenuation characteristics so the bass frequencies are attenuated in dependence of other frequencies which also cause displacement of the transducer 11. Advantageously the input audio signal is attenuated without removing entire portions of the bass frequency range and the timbre of the sound is maintained better after modification.

The transducer protection filter 31 in some embodiments comprises a combination of a single notch filter and a single shelf filter. The notch filter sensor frequency may be tuned to match the frequency of the highest peak in the displacement spectrum below the resonance frequency ($f_c$) of the transducer 11. The notch filter gain can be parameterised depending on the magnitude of the highest peak in the displacement spectrum below the resonance frequency of the transducer. The shelf filter gain and cut-off frequency may be determined based on the transducer displacement estimate, the determined maximum displacement of the transducer and the magnitude of the highest peak in the displacement spectrum below the resonance frequency ($f_c$) of the transducer.

In an alternative embodiment the transducer protection filter 31 may comprise a plurality of notch filters and/or shelf filters. The combination of notch filters and shelf filters used to attenuate the input audio signal X can be determined by a control signal from the analysing module 34.

In some embodiments the transducer protection filter 31 comprises a filter controlled by an inverse magnitude response with respect to the displacement spectrum below the resonance frequency of the transducer 11.

In some embodiments the analysing module 34 is calibrated by determining the coefficients for updating the transducer protection filter 31 based on one or more test tones. The analysing module 34 determines in response to the transducer displacement estimate and the frequency spectrum displacement information for one or more test tones the required attenuation and corresponding transducer protection filter coefficients for an input audio signal.

In some embodiments the apparatus 10 further modifies the input audio signal X on the basis of received environmental information of the transducer 11. In some embodiments the apparatus compensates the input audio signal X on basis of temperature information of the transducer 11.

The parameter estimation module 32 outputs one or more of the determined parameters of the transducer to a coil temperature estimation module 36. The coil temperature estimation module 36 may determine the temperature of a coil in the transducer 11. The coil may be a voice coil of a loudspeaker. The temperature of the coil may be determined based on the estimated resistance of the voice coil of the transducer 11. The coil temperature estimation module 36 outputs determined temperature information to a temperature analysis module 37. The temperature analysis module 37 determines the variation in temperature of the voice call of the transducer 11 during operation of the transducer 11. The temperature analysis module 37 may determine on the basis of the received temperature information that the transducer 11 operating differently due to the temperature. In some embodiments the coil temperature estimation module 36 and the temperature analysis module 37 may be the same modular entity.

On determination that the input audio signal requires compensation for environmental changes of the transducer, the temperature analysis module 37 updates coefficients of a temperature compensation filter 28.

The temperature compensation filter 38 modifies the input audio signal X to compensate for changes in performance of the transducer due to temperature.

In response to received coefficients, the temperature compensation filter 38 then outputs a temperature compensated audio signal to the protection filter 31 and the displacement estimation filter 33.

The temperature compensation filter 38 may be in some embodiments a single gain that is parameterised on the basis of temperature information received from the coil temperature estimation module.

The protection filter 31 outputs a modified audio signal to a resonance compensation filter 39. The resonance compensation filter 39 compensates for transducer 11 resonance. The resonance compensation filter 39 outputs a modified signal Y. The modified output audio signal Y is then sent to a digital-to-analogue converter and amplifier whereafter the output signal is sent to the transducer 11.

Advantageously since some embodiments of the invention estimate parameters of the transducer 11 based on voltage and current measurements, parameters of different transducers may be estimated. Furthermore, factors such as aging, dust and other environmental factors may be compensated for when the transducer protection filter 31 modifies the input audio signal X. In this way a maximum displacement of the transducer is not exceeded and the modified output audio signal is perceptually similar to the input audio signal and there may be no audible artefacts.

In some embodiments the process carried out in each module in FIG. 3 may be controlled by a single processor. Additionally or alternatively one or more modules may be controlled by a single processor 15. In some embodiments a processor 15 in the apparatus 10 controls other processors configured to control modules. In some embodiments, a chipset comprises one or more processors.

Figure 4:
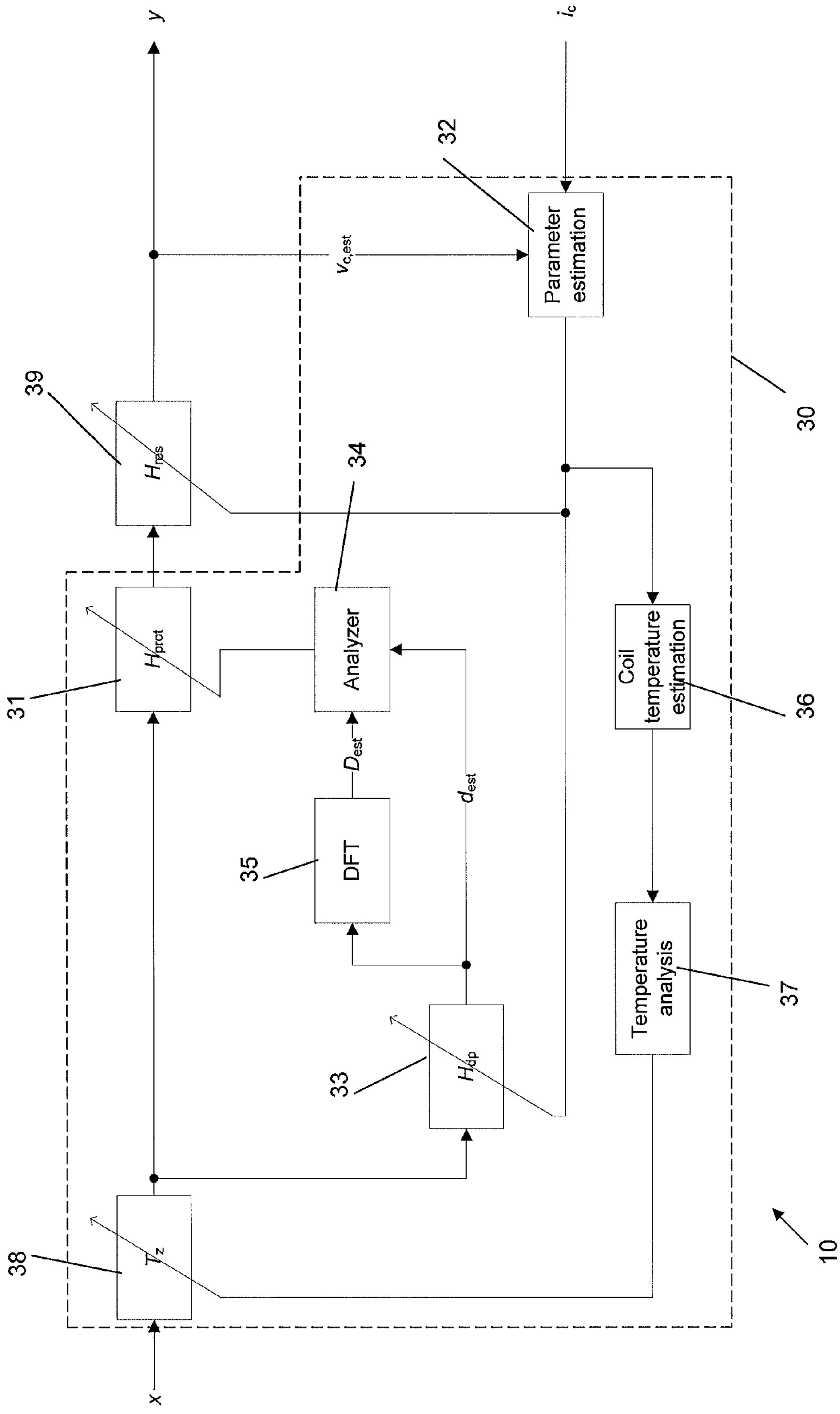
FIG. 4 illustrates a schematic block diagram of an apparatus according to yet some other embodiments.

FIG. 4 illustrates a block schematic diagram of the apparatus 10 according to some embodiments. FIG. 4 illustrates some embodiments which are the same as embodiments described with reference to FIG. 3 except that the parameter estimation module 32 estimates parameters of the transducer 11 based on an estimated voltage based on the modified output signal Y.

Figure 5:
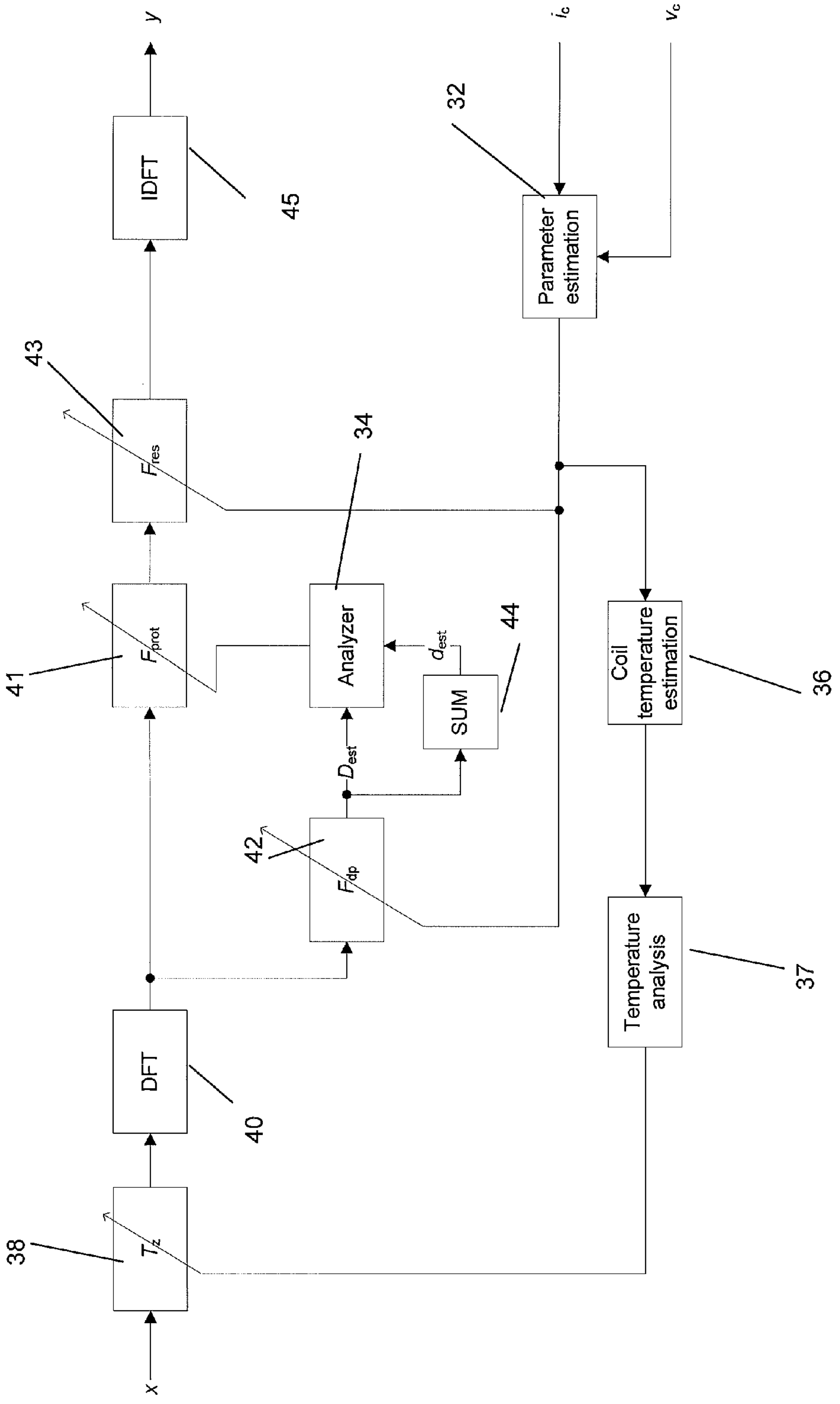
FIG. 5 illustrates a schematic block diagram of an apparatus according to some additional embodiments.

FIG. 5 illustrates a schematic block diagram of an apparatus 10 according to some additional embodiments. FIG. 5 is similar to embodiments described with reference to FIGS. 3 and 4 except that the protection module performs some operations in the frequency domain rather than the time domain.

The temperature compensation filter in some embodiments outputs a temperature compensated audio signal into a discrete Fourier transform module 40. The discrete Fourier transform module converts the input audio signal in the time domain into an input audio signal in the frequency domain.

The signal in the frequency domain is outputted from the discrete Fourier transform modular 40 into frequency domain protection filter 41 and frequency domain displacement estimation filter 42. The frequency domain protection filter 41 outputs an attenuated frequency domain signal to the frequency domain resonance compensation filter 43. In order to provide the analysing module 34 with a displacement estimation of the transducer a summing module 44 is used to sum the output from the frequency domain displacement estimation filter 42.

The operation of the filters is similar to that described in the embodiments with reference to FIGS. 3 and 4.

The frequency domain resonance compensation filter outputs the modified frequency domain signal to an inverse discrete Fourier transform module 45 which converts the modified output signal into the time domain. The modified output signal is then outputted as before. Advantageously, this means complex estimates can be achieved and the transducer protection filter 31 can be implemented with a plurality of different acoustic designs. In some embodiments, the transducer protection filter can be used in conjunction with a bass reflex enclosure.

Figure 6:
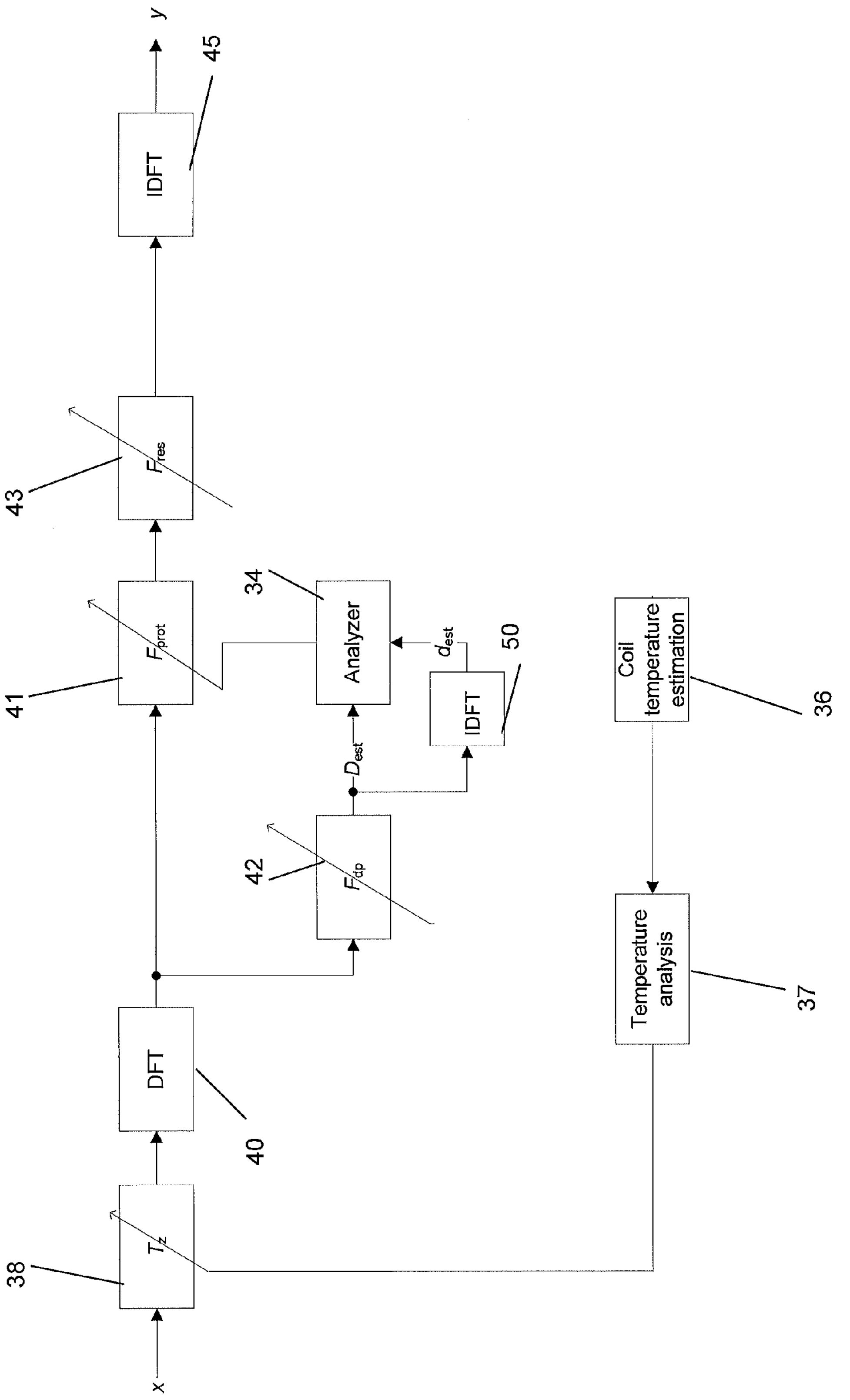
FIG. 6 illustrates a schematic block diagram according to further embodiments.

FIG. 6 illustrates a block schematic diagram of an apparatus 10 in accordance with some embodiments. FIG. 6 is the same as the embodiments described with reference to FIG. 5 except that the parameter estimation module 32 is not included. The frequency domain displacement estimation filter 42 is configured to receive parameter estimations from an inverse discrete Fourier transform module 50. The inverse discrete Fourier transform module 50 is configured to determine the estimated transducer displacement.

In some embodiments, the analysing module 34 compares determined transducer parameters with previously determined transducer parameters stored in memory. The stored parameters may be optimal parameters determined by a manufacturer during optimal performance of the transducer. Alternatively or additionally the stored transducer parameters are previously determined parameters of the transducer when the transducer is working normally.

The analysis module 34 after comparing determined transducer parameters and previous transducer parameters stored in memory may determine that there is a problem with the transducer. For example, the analysis module 34 may detect that transducer is unusually hot. The analysis module may send error information to the processor 15 of the apparatus. On receipt of the error information the processor 15 may instruct the transducer to cut out to prevent damage to the transducer. Additionally or alternatively, the processor 15 may indicate to the user an error with the transducer 11.

In some embodiments there may a combination of one or more of the previously described embodiments.

It shall be appreciated that the term portable device is user equipment. The user equipment is intended to cover any suitable type of wireless user equipment, such as mobile telephones, portable data processing devices or portable web browsers. Furthermore, it will be understood that the term acoustic sound channels is intended to cover sound outlets, channels and cavities, and that such sound channels may be formed integrally with the transducer, or as part of the mechanical integration of the transducer with the device.

In general, the various embodiments may be implemented in hardware or special purpose circuits, software, logic or any combination thereof. Some aspects of the invention may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

The embodiments of this invention may be implemented by computer software executable by a data processor of the mobile device, such as in the processor entity, or by hardware, or by a combination of software and hardware.

For example, in some embodiments the method of manufacturing the apparatus may be implemented with processor executing a computer program.

Further in this regard it should be noted that any blocks of the logic flow as in the Figures may represent program steps, or interconnected logic circuits, blocks and functions, or a combination of program steps and logic circuits, blocks and functions. The software may be stored on such physical media as memory chips, or memory blocks implemented within the processor, magnetic media such as hard disk or floppy disks, and optical media such as for example DVD and the data variants thereof, CD.

The memory may be of any type suitable to the local technical environment and may be implemented using any suitable data storage technology, such as semiconductor-based memory devices, magnetic memory devices and systems, optical memory devices and systems, fixed memory and removable memory. The data processors may be of any type suitable to the local technical environment, and may include one or more of general purpose computers, special purpose computers, microprocessors, digital signal processors (DSPs), application specific integrated circuits (ASIC), gate level circuits and processors based on multi-core processor architecture, as non-limiting examples.

Embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, Calif. and Cadence Design, of San Jose, Calif. automatically route conductors and locate components on a semiconductor chip using well established rules of design as well as libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

As used in this application, the term 'circuitry' refers to all of the following:

(a) hardware-only circuit implementations (such as implementations in only analog and/or digital circuitry) and (b) to combinations of circuits and software (and/or firmware), such as: (i) to a combination of processor(s) or (ii) to portions of processor(s)/software (including digital signal processor(s)), software, and memory(ies) that work together to cause an apparatus, such as a mobile phone or server, to perform various functions and (c) to circuits, such as a microprocessor(s) or a portion of a microprocessor(s), that require software or firmware for operation, even if the software or firmware is not physically present.

This definition of 'circuitry' applies to all uses of this term in this application, including any claims. As a further example, as used in this application, the term 'circuitry' would also cover an implementation of merely a processor (or multiple processors) or portion of a processor and its (or their) accompanying software and/or firmware. The term 'circuitry' would also cover, for example and if applicable to the particular claim element, a baseband integrated circuit or applications processor integrated circuit for a mobile phone or similar integrated circuit in server, a cellular network device, or other network device.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims. Indeed in there is a further embodiment comprising a combination of one or more of any of the other embodiments previously discussed.

The invention claimed is:

1. An apparatus comprising:

at least one processor; and at least one memory including computer program code; the at least one memory and the computer program code configured to, with the at least one processor, cause the apparatus at least to:

determine at least one parameter of a transducer on the basis of received information; and modify a received signal for actuating the transducer on the basis of the determined at least one parameter of the transducer and a frequency spectrum of the received signal;

wherein the apparatus comprises a first filter configured to modify the received signal, wherein the first filter is configured to attenuate a first portion of the frequency spectrum in dependence of a second portion of the frequency spectrum.

2. An apparatus according to claim 1 wherein the processor is configured to output a modified signal for the transducer.

3. An apparatus according to claim 2 wherein the at least one parameter is determined from one or more of the following: voltage across the poles of the transducer, current through the transducer, voltage of the modified signal to be outputted to the transducer; and wherein the at least one parameter is one or more of the following; impedance of the transducer, resistance of a component of the transducer, transduction coefficient, resonance frequency and resonance Q value.

4. An apparatus according to claim 1 wherein the apparatus comprises a second filter for compensating the received signal on the basis of received information comprising environmental information of the transducer wherein the environmental information is temperature information of the transducer.

5. An apparatus according to claim 1 wherein the processor is configured to retrieve a maximum displacement of a first part of the transducer from a second part of the transducer; and wherein the received signal for actuating the transducer is configured to displace the first part of the transducer from the second part of the transducer.

6. An apparatus according to claim 5 wherein the processor is configured to estimate a displacement of the first part of the transducer from the second part of the transducer on the basis of the received signal.

7. An apparatus according to claim 5 wherein the first filter attenuates the received signal when the processor determines that the estimated displacement first part of the transducer from second part of the transducer is greater than the maximum displacement.

8. An apparatus according to claim 1 wherein processor is configured to dynamically determine the at least one parameter of the transducer.

9. An apparatus according to claim 1 is an user terminal.

10. A method comprising:

determining at least one parameter of a transducer on the basis of received information; and attenuating a received signal for actuating the transducer on the basis of the determined at least one parameter of the transducer and a frequency spectrum of the received signal, wherein said attenuating comprises attenuating a first portion of the frequency spectrum in dependence of a second portion of the frequency spectrum.

11. A method according to claim 10 wherein the method further comprises outputting a modified signal for the transducer.

12. A method according to claim 11 wherein the at least one parameter is determined from one or more of the following: voltage across the poles of the transducer, current through the transducer, voltage of the modified signal to be outputted to the transducer; and wherein the at least one parameter is one or more of the following; impedance of the transducer, resistance of a component of the transducer, transduction coefficient, resonance frequency and resonance Q value.

13. A method according to claim 10 wherein the method comprises compensating the received signal on the basis of received information comprising environmental information of the transducer; and wherein the environmental information is temperature information of the transducer.

14. A method according to claim 10 wherein the method comprises determining a maximum displacement of a first part of the transducer from a second part of the transducer; and wherein the received signal for actuating the transducer displaces the first part of the transducer from the second part of the transducer.

15. A method according to claim 14 wherein the method comprises estimating a displacement of the first part of the transducer from the second part of the transducer on the basis of the received signal.

16. A method according to claim 15 wherein the method comprises attenuating the received signal when determining that the estimated displacement of the first part of the transducer from the second part of the transducer is greater than the maximum displacement.

17. A method according to claim 10 wherein the method comprises dynamically determining the at least one parameter of the transducer.

18. A computer program product embodied on a non-transitory computer-readable medium in which a computer program is stored that, when being executed by a computer, is configured to provide instructions to control or carry out:

determining at least one parameter of a transducer on the basis of received information; and attenuating a received signal for actuating the transducer on the basis of the determined at least one parameter of the transducer and a frequency spectrum of the received signal, wherein said attenuating comprises attenuating a first portion of the frequency spectrum in dependence of a second portion of the frequency spectrum.

19. A method according to claim 18 wherein the method comprises compensating the received signal on the basis of received information comprising environmental information of the transducer; and wherein the environmental information is temperature information of the transducer.

20. A method according to claim 18 wherein the method comprises determining a maximum displacement of a first part of the transducer from a second part of the transducer; and wherein the received signal for actuating the transducer displaces the first part of the transducer from the second part of the transducer.

* * * * *